United States Patent
Yoon

(10) Patent No.: US 10,998,525 B2
(45) Date of Patent: May 4, 2021

(54) ORGANIC LIGHT EMITTING DISPLAY DEVICE AND METHOD FOR MANUFACTURING THE SAME

(71) Applicant: LG Display Co., Ltd., Seoul (KR)

(72) Inventor: HyunWoo Yoon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/715,731

(22) Filed: Dec. 16, 2019

(65) Prior Publication Data

US 2020/0194726 A1    Jun. 18, 2020

(30) Foreign Application Priority Data

Dec. 18, 2018    (KR) .................. 10-2018-0164339

(51) Int. Cl.
*H01L 51/52*    (2006.01)
*H01L 27/32*    (2006.01)

(52) U.S. Cl.
CPC ...... *H01L 51/5256* (2013.01); *H01L 27/3276* (2013.01)

(58) Field of Classification Search
None
See application file for complete search history.

(56) References Cited

U.S. PATENT DOCUMENTS 8,907,561 B2 * 12/2014 Ryu ............... H01L 51/5243
313/512

* cited by examiner

*Primary Examiner* — Robert K Carpenter
(74) *Attorney, Agent, or Firm* — Fenwick & West LLP

(57) ABSTRACT

An organic light emitting display device includes a base substrate, pixels disposed on the base board, panel terminals disposed on the base board to be electrically connected to the pixels, and an encapsulation structure coupled to the base board to cover the pixels. The encapsulation structure includes a base part, a metal encapsulation film, first terminals, and second terminals. The metal encapsulation film is disposed in an encapsulation area of the base part, the first terminals are disposed on a first surface of the base part corresponding to a connection area of the base part, and the first terminals are electrically connected to the panel terminals. The second terminals are disposed on a second surface of the base part corresponding to the connection area, and the second terminals are electrically connected to the first terminals.

6 Claims, 8 Drawing Sheets

ORGANIC LIGHT EMITTING DISPLAY DEVICE AND METHOD FOR MANUFACTURING THE SAME

CROSS-REFERENCE TO RELATED APPLICATIONS

This application claims priority to Republic of Korea Patent Application No. 10-2018-0164339, filed on Dec. 18, 2018, which is incorporated by reference in its entirety.

BACKGROUND

Field of the Disclosure

The present disclosure relates to an organic light emitting display device and a method for manufacturing the same, and more particularly, to an organic light emitting display device including an encapsulation structure and a method for manufacturing the same.

Description of the Related Art

An organic light emitting display device is a device for displaying an image, and the organic light emitting display device includes an organic light emitting display panel and a circuit board bonded thereto to transmit various signals such as a data signal to the organic light emitting display panel side.

The organic light emitting display panel includes a board and a plurality of pixels disposed on the board, and the plurality of pixels include organic light emitting diodes and the organic light emitting display panel displays an image by using the light outputted from the plurality of pixels. In addition, to prevent the organic light emitting diodes from being deteriorated due to exposure to moisture or air, or to protect the organic light emitting diodes from external impacts, the organic light emitting display panel is provided with an encapsulation structure for covering the organic light emitting diodes.

The circuit board is electrically connected to signal wirings provided inside the organic light emitting display panel. In addition, an electronic part such as a driver integrated circuit (IC) is mounted on the circuit board, or the circuit board is electrically connected to a printed circuit board such as a main board. Therefore, various signals for driving the plurality of pixels, such as data signals, are transmitted to the organic light emitting display panel side through the circuit board.

The wirings provided on the circuit board are bonded to the signal wirings provided on the pad part of the organic light emitting display panel, and generally, the circuit board is bonded to the organic light emitting display panel by using an anisotropic conductive film (ACF).

SUMMARY

An object of the present disclosure is to provide an organic light emitting display device having an encapsulation structure in which an electric circuit is embedded.

Another object of the present disclosure is to provide a method for manufacturing an organic light emitting display device having an encapsulation structure in which an electric circuit is embedded.

An organic light emitting display device for achieving the objects of the present disclosure described above includes a base substrate, a plurality of pixels disposed on the base substrate, a plurality of panel terminals disposed on the base substrate to be electrically connected to the plurality of pixels, and an encapsulation structure coupled to the base substrate to cover the plurality of pixels.

The encapsulation structure includes a base part, a metal encapsulation film, a plurality of first terminals, and a plurality of second terminals. The base part has an encapsulation area and a connection area defined therein, and has the insulating property. The metal encapsulation film is disposed on a base part corresponding to the encapsulation area. The plurality of first terminals are disposed on a first surface of the base part corresponding to the connection area, and the plurality of first terminals are electrically connected to the plurality of panel terminals. The plurality of second terminals are disposed on a second surface of the base part opposite to the first surface corresponding to the connection area, and the plurality of second terminals are electrically connected to the plurality of first terminals.

A method for manufacturing an organic light emitting display device for achieving the objects of the present disclosure described above is as follows.

An encapsulation structure is formed, and the encapsulation structure covers a pixel layer provided on a base substrate.

A method for forming the encapsulation structure is as follows. A plurality of first terminals are formed on a first surface of a base part corresponding to a connection area, and a plurality of second terminals electrically connected to the plurality of first terminals are formed on a second surface opposite to the first surface of the base part corresponding to the connection area. A metal encapsulation film is formed on the first surface and the second surface of the base part corresponding to the encapsulation area.

A method for covering the pixel layer by the encapsulation structure is as follows. The encapsulation structure is adhered to the base substrate. The plurality of first terminals of the encapsulation structure are electrically connected to the plurality of panel terminals disposed on the base substrate.

DETAILED DESCRIPTION

Figure 1:
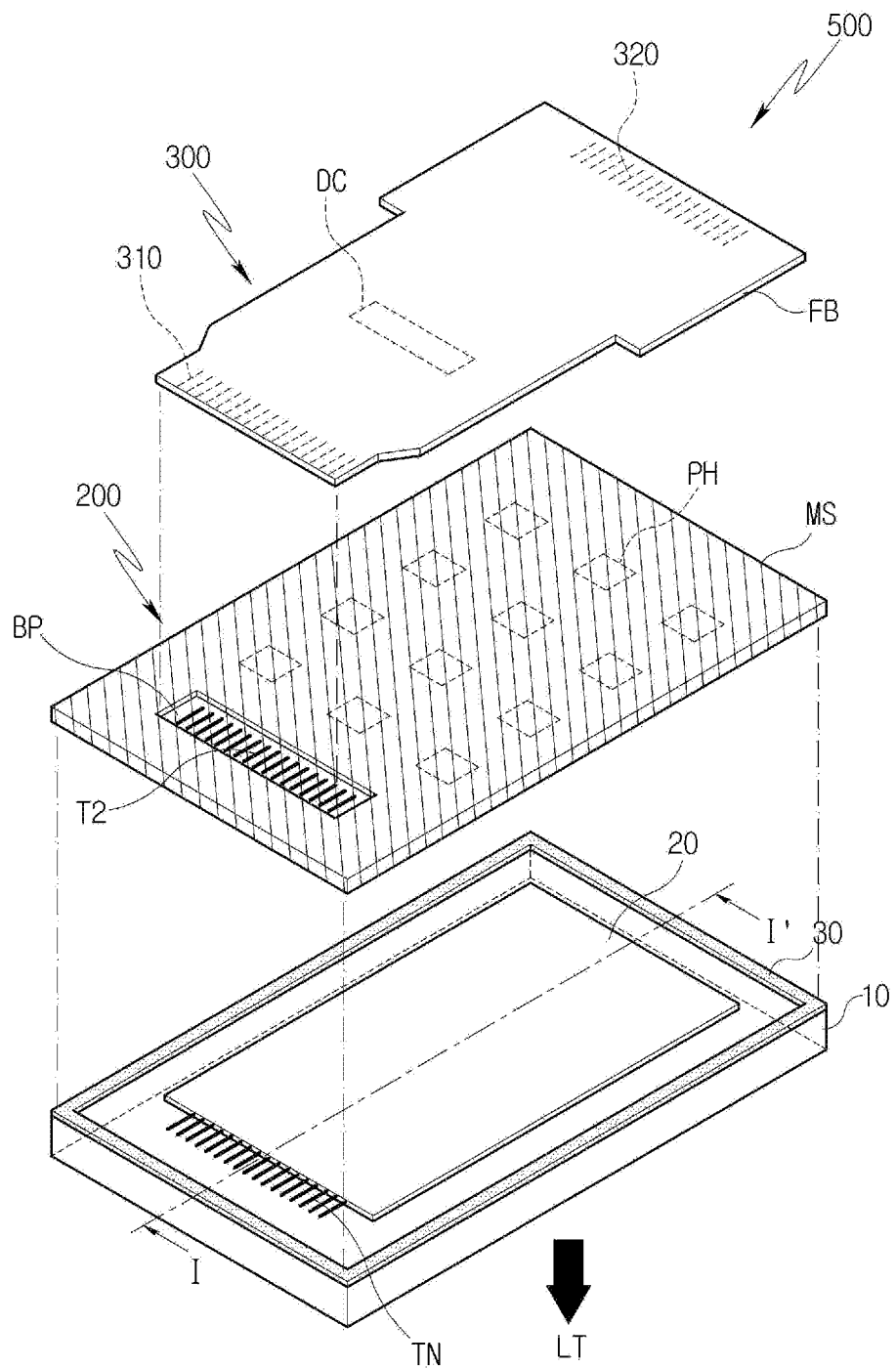
FIG. 1 is an exploded perspective diagram of an organic light emitting display device according to an embodiment of the present disclosure.

Hereinafter, the various embodiments of the present disclosure will be described with reference to the accompanying drawings in order to explain in detail so that those skilled in the art can easily practice the technical spirit of the present disclosure. First, in denoting the reference numerals to the components in each drawing, it should be noted that the same components are denoted by the same reference numerals as possible even though they are illustrated in different drawings. In addition, in the description of the present disclosure, a specific description of related known configurations or functions will be omitted when it is determined to obscure the subject matter of the present disclosure.

Figure 2:
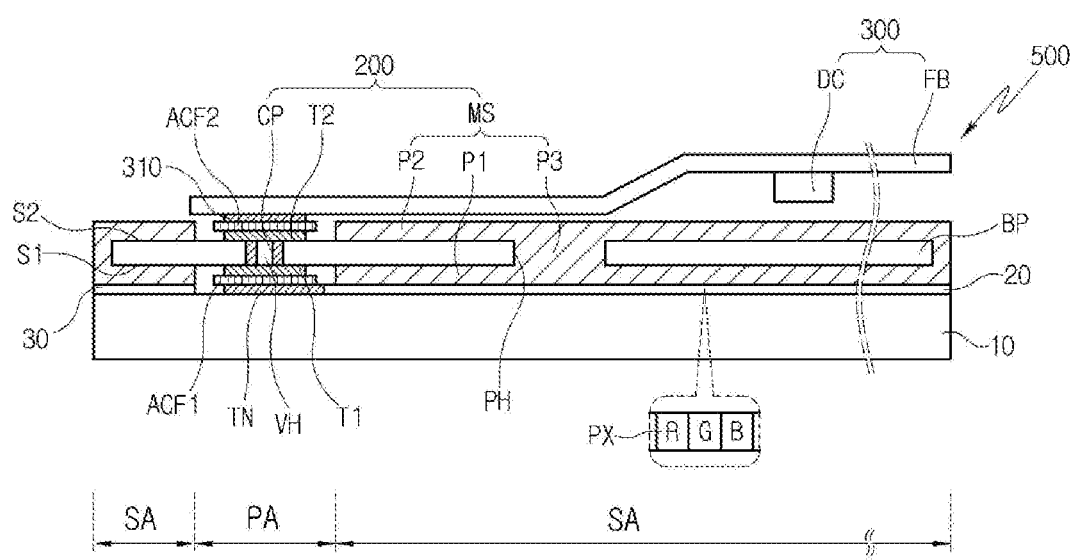
FIG. 2 is a cross-sectional diagram illustrating a portion taken along the line I-I' illustrated in FIG. 1 according to an embodiment of the present disclosure.
Figure 3:
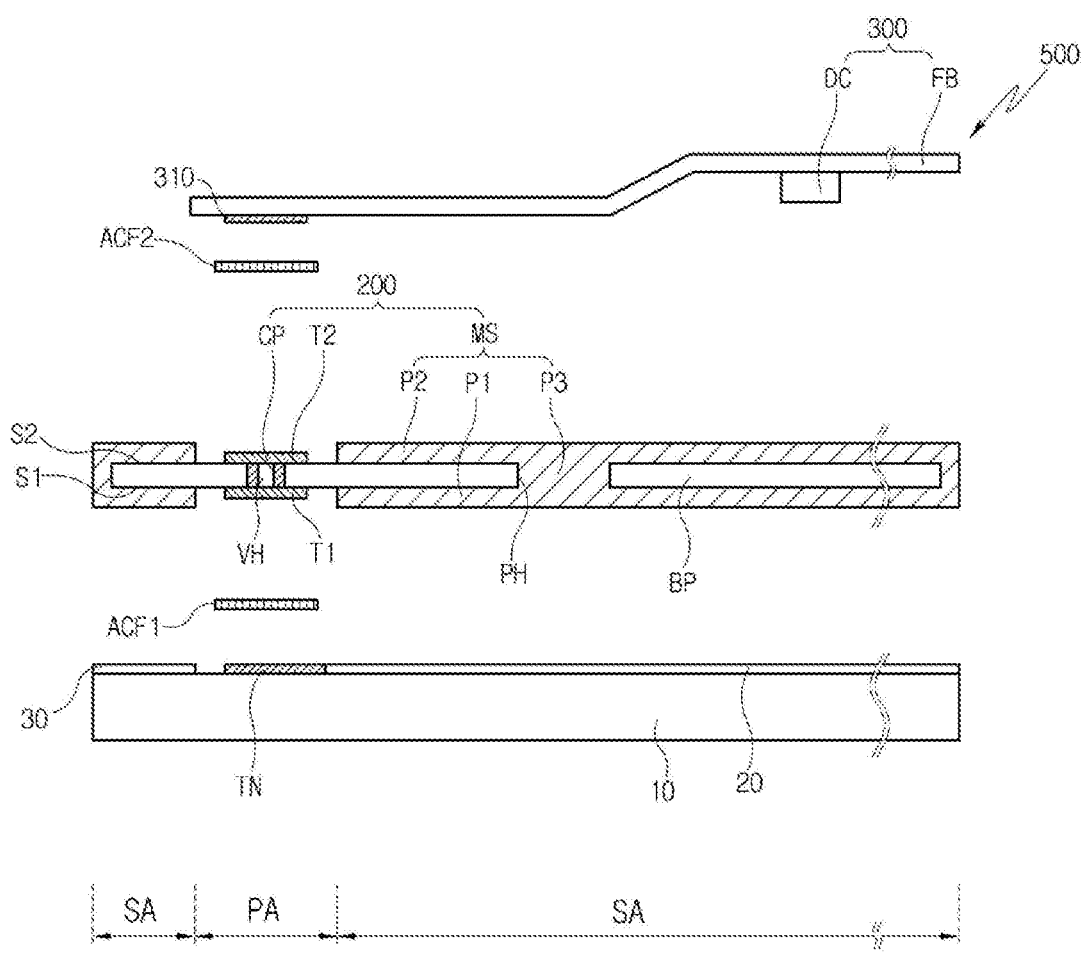
FIG. 3 is a diagram separately illustrating an organic light emitting display panel, an encapsulation structure, and a circuit board of the organic light emitting display device illustrated in FIG. 2 according to an embodiment of the present disclosure.

FIG. 1 is an exploded perspective diagram of an organic light emitting display device according to an embodiment of the present disclosure, FIG. 2 is a cross-sectional diagram illustrating a portion taken along the line I-I' illustrated in FIG. 1, and FIG. 3 is a diagram separately illustrating an organic light emitting display panel, an encapsulation structure, and a circuit board of the organic light emitting display device illustrated in FIG. 2.

Referring to FIGS. 1, 2, and 3, an organic light emitting display device 500 includes a base substrate 10, a pixel part 20, a plurality of panel terminals TN, an encapsulation structure 200, and a circuit board 300.

The base substrate 10 can be a glass board or a plastic board made of plastic such as polyimide. In this embodiment, the base substrate 10 has the characteristic of transmitting light.

The pixel part 20 is disposed on the base substrate 10. The pixel part 20 includes a plurality of pixels PX, and the plurality of pixels PX are arranged in a matrix shape in the row direction and the column direction. The plurality of pixels PX output the light LT, and the organic light emitting display device 500 displays an image by using the light LT outputted from the plurality of pixels PX.

In this embodiment, each of the plurality of pixels PX can include a driving transistor (not illustrated) and an organic light emitting diode (not illustrated). The driving transistor is electrically connected with the organic light emitting diode to switch the turn-off operation of the organic light emitting diode. The organic light emitting diode includes an anode electrically connected to the driving transistor, a cathode to which a common voltage is applied, and an organic light emitting layer interposed between the anode and the cathode, and the organic light emitting layer can emit the light LT by a recombination of a hole provided through the anode and an electron provided through the cathode.

In this embodiment, although the plurality of pixels PX have the above-described structure, the present disclosure is not limited to the structure of the plurality of pixels PX. For example, in another embodiment, the plurality of pixels PX can include an organic light emitting layer that emits white light, and in this case, each of the plurality of pixels PX can further include a color filter for filtering the white light into color light.

A plurality of panel terminals TN are disposed on the base substrate 10 corresponding to a connection area PA. The plurality of panel terminals TN are connected to various wirings (not illustrated) for driving the plurality of pixels PX, and for example, the plurality of panel terminals TN can be electrically connected to a plurality of data lines (not illustrated) and a driving power line (not illustrated) connected to the plurality of pixels PX.

The encapsulation structure 200 is coupled to the base substrate 10. More specifically, an adhesive layer 30 having a closed loop shape is provided to the base substrate 10 along the edge of the base substrate 10, and the encapsulation structure 200 is coupled to the base substrate 10 by the adhesive layer 30.

The encapsulation structure 200 is coupled to the base substrate 10 to cover the plurality of panel terminals TN and the pixel part 20. That is, in this embodiment, not only the pixel part 20 but also the plurality of panel terminals TN are disposed in a space surrounded and sealed by the encapsulation structure 200, and the plurality of panel terminals TN disposed on the base substrate 10 are connected to the conductive components embedded in the encapsulation structure 200.

In this embodiment, the encapsulation structure 200 includes a base part BP, a metal encapsulation film MS, a plurality of first terminals T1, a plurality of second terminals T2, and a plurality of connection parts CP.

In this embodiment, the base part BP has a plate shape, and a connection area PA and an encapsulation area SA can be defined in the base part BP. The base part BP can be made of a material having the insulating property, and for example, in this embodiment, the base part BP can be made of polyimide (PI).

The base part BP is formed with a plurality of via holes VH and a plurality of through-holes PH through the base part BP. More specifically, the plurality of via holes VH can be formed in the base part BP corresponding to the connection area PA, and the connection part CP can be received inside each of the plurality of via holes VH. The plurality of through-holes PH can be formed in the base part BP corresponding to the encapsulation area SA.

In this embodiment, the plurality of through-holes PH can be formed at regular intervals in the entire area of the base part BP corresponding to the encapsulation area SA. When the metal encapsulation film MS is formed on the base part BP by a plating treatment, the plurality of through-holes PH can act as a flow path through which the plating liquid passes.

The metal encapsulation film MS is disposed on the base part BP corresponding to the encapsulation area SA to cover the pixel part 20. In this embodiment, the metal encapsulation film MS can include a first portion P1, a second portion P2, and a third portion P3. The first portion P1 of the metal encapsulation film MS is disposed on a first surface S1 of the base part BP corresponding to the encapsulation area SA, and the second portion P2 of the metal encapsulation film MS is disposed on the second surface S2 of the base part BP opposed to the first surface S1 corresponding to the encapsulation area SA. In addition, the third portion P3 of the metal encapsulation film MS is filled in the plurality of through-holes PH.

In terms of a method for manufacturing the metal encapsulation film MS, in this embodiment, the metal encapsulation film MS can be formed on the base part BP by using the plating treatment. Therefore, the metal encapsulation film MS can have a shape coated or plated on the surface of the base part BP, and the first portion P1, the second portion P2, and the third portion P3 of the metal encapsulation film MS can have an integrally formed shape.

The plurality of first terminals T1 are disposed in the connection area PA of the base part BP. In addition, the plurality of first terminals T1 are disposed on the first surface S1 of the base part BP.

The plurality of first terminals T1 can be electrically connected to the plurality of panel terminals TN disposed on the base substrate 10. In this embodiment, a first anisotropic conductive film ACF1 is interposed between the plurality of first terminals T1 and the plurality of panel terminals TN so that the plurality of first terminals T1 can be electrically connected to the plurality of panel terminals TN by the first anisotropic conductive film ACF1.

The plurality of second terminals T2 are disposed in the connection area PA of the base part BP. In addition, the plurality of second terminals T2 are disposed on the second surface S2 of the base part BP. The plurality of second terminals T2 are electrically connected to the plurality of first terminals T1.

More specifically, for example, explaining referring to FIG. 2, one second terminal T2 of the plurality of second terminals T2 and one first terminal T1 of the plurality of first terminals T1 overlapped therewith, the via hole VH is formed through the base part BP overlapped with the second terminal T2 and the first terminal T1, and the connection part CP is formed inside the via hole VH. The connection part CP is disposed between the second terminal T2 and the first terminal T1 to contact the second terminal T2 and the first terminal T1.

In this embodiment, in terms of the manufacturing method, the second terminal T2 and the first terminal T1 can be made of a metal such as copper, and a laser is irradiated to the second terminal T2 and the first terminal T1 side so that the metal layers constituting the second terminal T2 and the first terminal T1 can be partially melted. In addition, the melted portion of the metal layers is integrated with the second terminal T2 and the first terminal T1, and the melted portion of the metal layers is hardened inside the via hole VH to form the connection part CP.

As described above, the plurality of second terminals T2 are connected to the plurality of first terminals T1 by the plurality of connection parts CP inside the encapsulation structure 200. In addition, before the encapsulation structure 200 is bonded to the circuit board 300, the plurality of second terminals T2 having the above-described structure are exposed to the outside in the connection area PA.

The circuit board 300 is electrically connected to the plurality of second terminals T2 of the encapsulation structure 200. In this embodiment, a second anisotropic conductive film ACF2 can be interposed between the plurality of second terminals T2 and external terminals 310 of the circuit board 300, and the plurality of second terminals T2 can be electrically connected to the external terminals 310 by the second anisotropic conductive film ACF2.

In this embodiment, the circuit board 300 can be disposed on the encapsulation structure 200, and the circuit board 300 can be a flexible printed circuit board for a chip on film (COF) package. In this case, the circuit board 300 can include a flexible film FB, wirings (not illustrated) printed on the flexible film FB, a plurality of external terminals 310, 320 connected to the wirings, and a driving chip DC mounted on the flexible film FB.

In this embodiment, the external terminals 320 of the circuit board 300 can be electrically connected to a printed circuit board (not illustrated). Therefore, the control signals and the power supply signals generated from the printed circuit board can be output to the plurality of pixels PX side through the circuit board 300, and the data signals generated from the driving chip DC of the circuit board 300 can be output to the plurality of pixels PX side.

As described above, in this embodiment, the chip-on-film type circuit board 300 is electrically connected to the plurality of second terminals T2 of the encapsulation structure 200, but in another embodiment, another electronic element can be electrically connected to the plurality of second terminals T2. For example, an electronic element such as a micro speaker, a driving chip, or an image sensor designed by a Micro Electro Mechanical Systems (MEMS) method can also be bonded to the plurality of second terminals T2, and in this case, an electric signal between the electronic element and the plurality of pixels PX can be transmitted by the conductive components such as the plurality of second terminals T2 and the plurality of first terminals T1 embedded in the encapsulation structure 200.

Hereinafter, a structure of the encapsulation structure 200 will be described in more detail further with reference to FIGS. 4 and 5 as follows.

Figure 4:
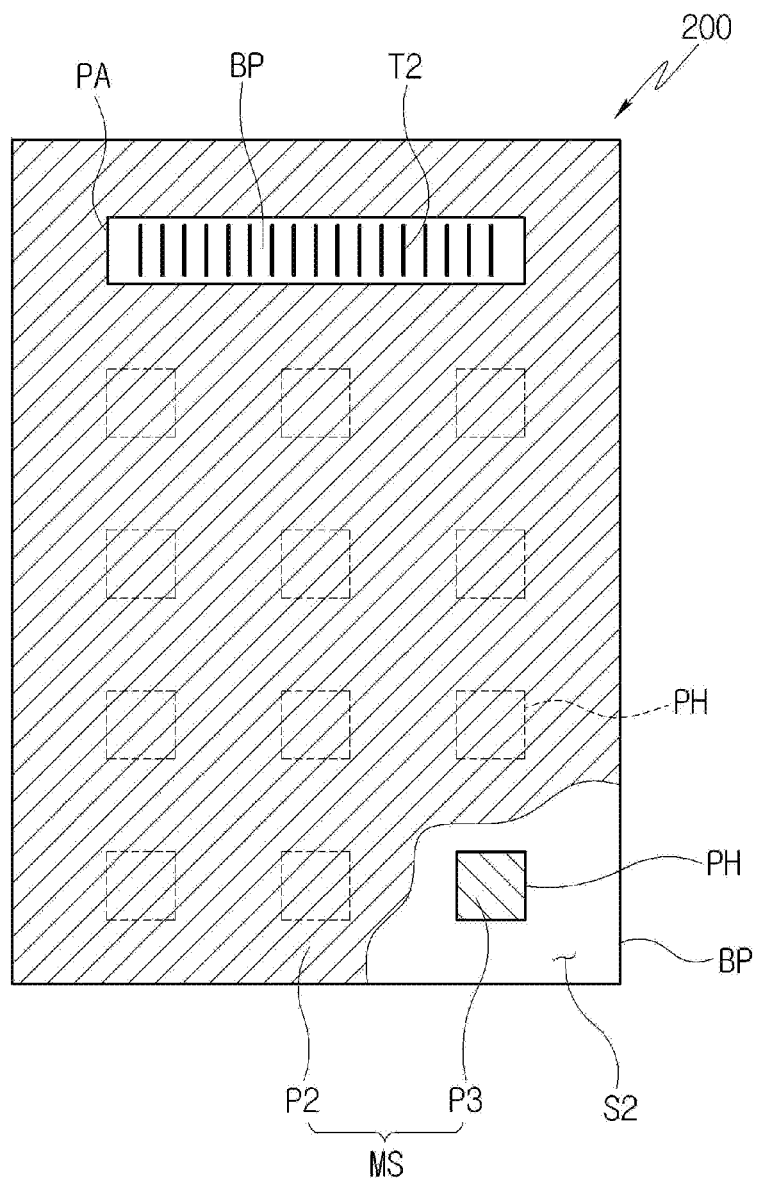
FIG. 4 is a plane diagram of the encapsulation structure illustrated in FIG. 1 according to an embodiment of the present disclosure.
Figure 5:
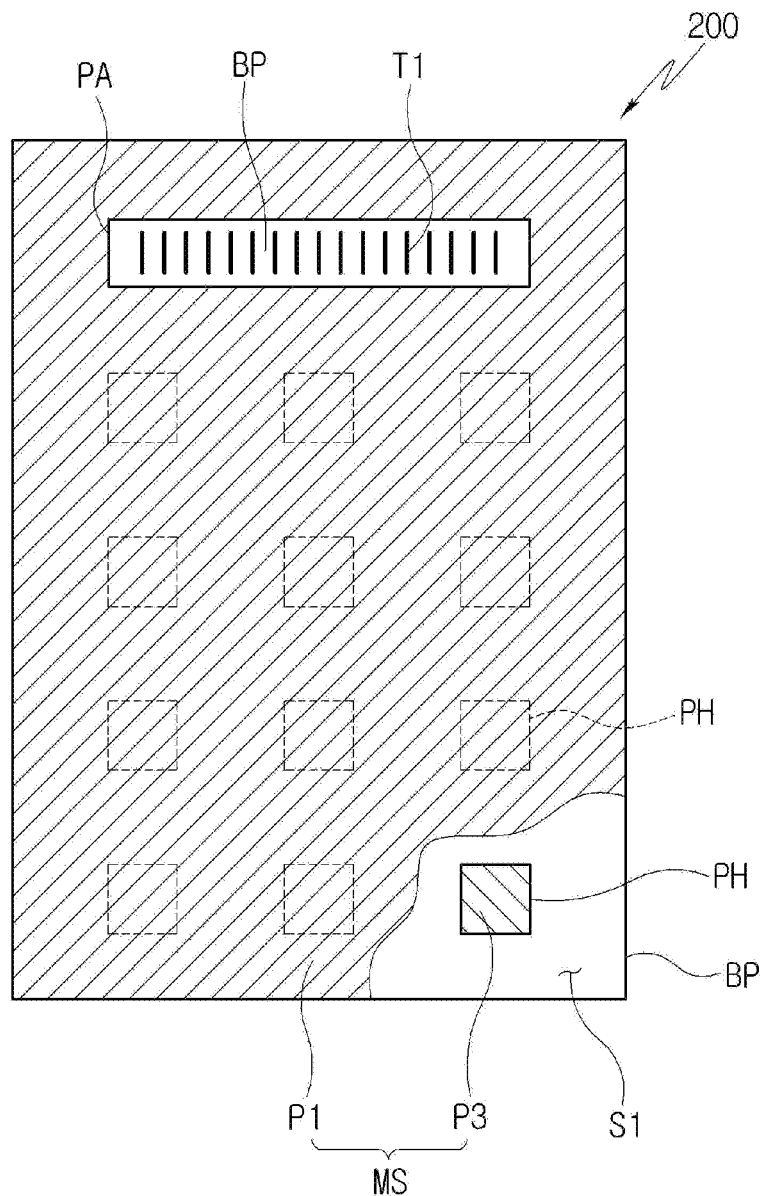
FIG. 5 is a rear diagram of the encapsulation structure illustrated in FIG. 1 according to an embodiment of the present disclosure.

FIG. 4 is a plane diagram of the encapsulation structure 200 illustrated in FIG. 1, and FIG. 5 is a rear diagram of the encapsulation structure 200 illustrated in FIG. 1. For convenience of explanation, FIG. 4 illustrates by partially removing the second portion P2 of the metal encapsulation film MS disposed on the second surface S2 of the base part BP, and FIG. 5 illustrates by partially removing the first portion P1 of the metal encapsulation film MS disposed on the first surface S1 of the base part BP.

Referring to FIGS. 2 and 4, the plurality of second terminals T2 are disposed in the connection area PA of the encapsulation structure 200, and the plurality of second terminals T2 are exposed to the outside in a state where the encapsulation structure 200 has not been bonded to the circuit board (300 in FIG. 1).

The plurality of through-holes PH are formed in the base part BP, and the metal encapsulation film MS is disposed on the base part BP. The metal encapsulation film MS includes the first portion (P1 in FIG. 5) disposed on the first surface (S1 in FIG. 5), the second portion P2 disposed on the second surface S2, and the third portion P3 filled inside the plurality of through-holes PH.

The second portion P2 has an opened shape corresponding to the connection area PA. Therefore, the base part BP disposed below the second portion P2 corresponding to the connection area PA and the plurality of second terminals T2 disposed on the base part BP can be exposed to the outside, and therefore, the plurality of second terminals T2 exposed to the outside can be bonded to the external terminals (310 in FIG. 2) of the circuit board (300 in FIG. 2).

Referring to FIGS. 2 and 5, the plurality of first terminals T1 are disposed in the connection area PA of the encapsulation structure 200, and the plurality of first terminals T1 are exposed to the outside before the encapsulation structure 200 is bonded to the base substrate (10 in FIG. 2) on which the plurality of pixels (PX in FIG. 2) are provided.

The first portion P1 of the metal encapsulation film MS has an opened shape corresponding to the connection area PA. Therefore, the base part BP disposed below the first portion P1 corresponding to the connection area PA and the plurality of first terminals T1 disposed on the base part BP can be exposed to the outside, and therefore, the plurality of first terminals T1 exposed to the outside can be bonded to the plurality of panel terminals (TN in FIG. 2) provided on the base substrate (10 in FIG. 2).

FIGS. 6A to 6G are diagrams illustrating a method for manufacturing the organic light emitting display device illustrated in FIG. 2. Meanwhile, in the description of FIGS. 6A to 6G, the above-described components are denoted by the same reference numerals, and a redundant description of the components is omitted.

Figure 6A:
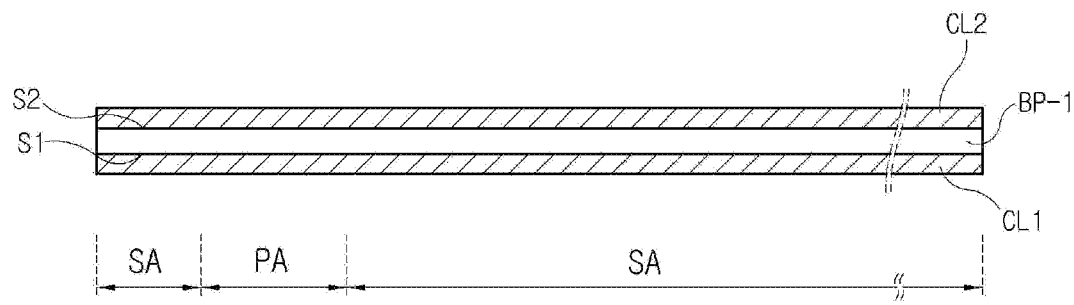
FIGS. 6A to 6G are diagrams illustrating a method for manufacturing the organic light emitting display device illustrated in FIG. 2 according to an embodiment of the present disclosure.
Figure 6B:

Referring to FIGS. 6A and 6B, a first metal layer CL1 is formed on the first surface S1 of a dummy base part BP-1, and a second metal layer CL2 is formed on the second surface S2 of the dummy base part BP-1. More specifically, as described above with reference to FIG. 2, when the connection area PA and the encapsulation area SA are defined in the encapsulation structure (200 in FIG. 2), the first metal layer CL1 can be formed on the first surface S1 corresponding to the connection area PA and the encapsulation area SA, and the second metal layer CL2 can be formed on the second surface S2 corresponding to the connection area PA and the encapsulation area SA.

In this embodiment, the dummy base part BP-1 can be made of an insulating material such as polyimide, and each of the first metal layer CL1 and the second metal layer CL2 can be made of copper.

Meanwhile, the present disclosure is not limited to the method for forming the first metal layer CL1 and the second metal layer CL2 on the dummy base part BP-1. For example, in an embodiment, the first and second metal layers CL1, CL2 can be formed by laminating a metal thin film by using an adhesive agent on the dummy base part BP-1. In another embodiment, the first and second metal layers CL1, CL2 can be formed on the dummy base part BP-1 by using the plating treatment, and in this case, before the plating treatment, a seed layer of the plating treatment can be formed by performing a process of modifying the surface of the dummy base part BP-1 or by using a sputtering process on the surface of the dummy base part BP-1. As a result, the process of forming the first and second metal layers CL1, CL2 using the plating treatment can be performed more easily.

Thereafter, the first metal layer CL1 is patterned to form a plurality of first dummy terminals T1-1, and the second metal layer CL2 is patterned to form a plurality of second dummy terminals T2-1. More specifically, a portion of the first metal layer CL1 and a portion of the second metal layer CL2 corresponding to the encapsulation area SA are removed so that the plurality of first dummy terminals T1-1 and the plurality of second dummy terminals T2-1 can be formed in the connection area PA.

Figure 6C:
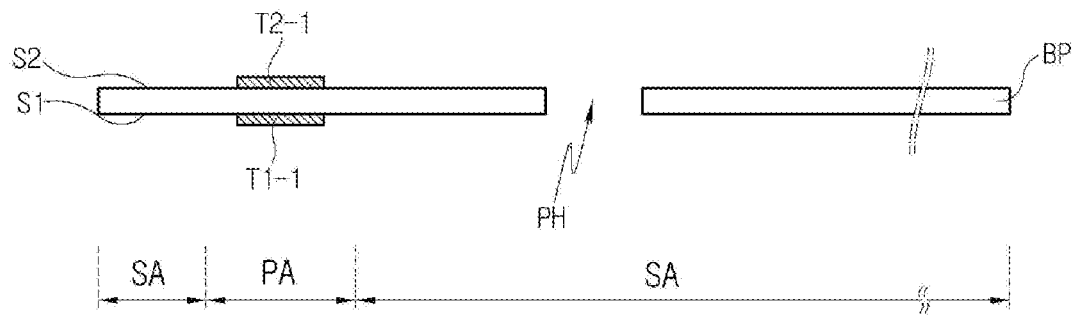

Referring to FIG. 6C, the plurality of through-holes PH are formed in the dummy base part (BP-1 in FIG. 6B) corresponding to the encapsulation area SA to form the base part BP. Each of the plurality of through-holes PH can be formed to penetrate the base part BP. The present disclosure is not limited to the position and the number of the plurality of through-holes PH, but as illustrated in FIGS. 4 and 5, the plurality of through-holes PH can be formed in the base part BP at regular intervals.

Figure 6D:
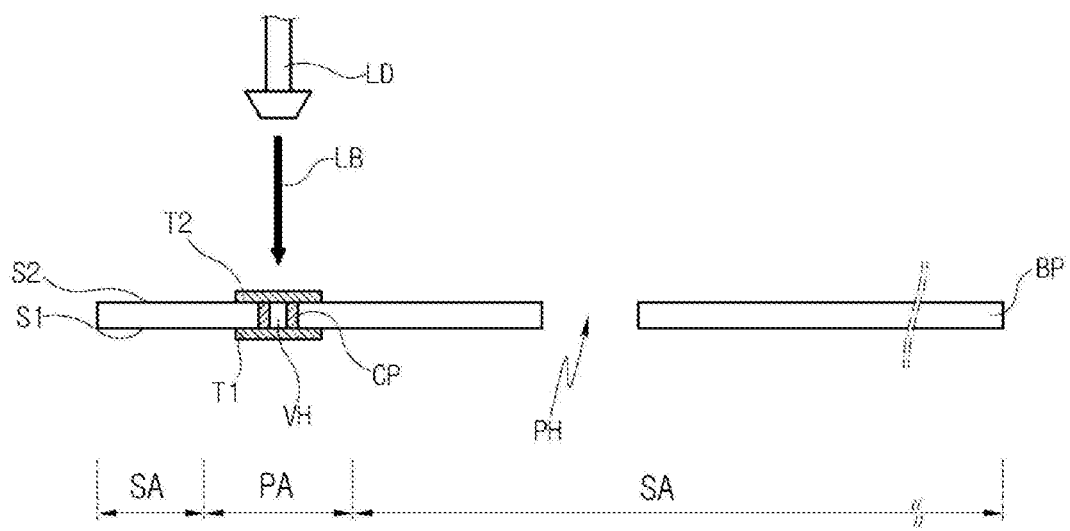

Referring to FIG. 6D, the plurality of first terminals T1 are electrically connected to each of the plurality of second terminals T2 by using a laser irradiation device LD. One first terminal T1 of the plurality of first terminals T1 and one second terminal T2 overlapped with the first terminal T1 of the plurality of second terminals T2 can be, for example, described in more detail as follows.

The laser irradiation device LD is disposed at the upper portion of the base part BP, and then a portion of the laser irradiation device LD in which the laser LB is output is aligned with the first terminal T1 and the second terminal T2. Thereafter, the laser irradiation device LD is driven to irradiate the laser LB to the first terminal T1 and the second terminal T2.

When the laser LB is irradiated, the energy of the laser LB is transferred in the order of the second terminal T2, the base part BP, and the first terminal T1, and in this procedure, a portion of each of the second terminal T2 and the first terminal T1 is melted by the energy of the laser LB. In addition, a portion of the base part BP disposed between the second terminal T2 and the first terminal T1 is burned out by the energy of the laser, and therefore, the via hole VH having a shape penetrating the base part BP is formed in the base part BP.

Therefore, the metal in which the second terminal T2 and the first terminal T1 have been partially melted is received in the via hole VH, and the molten metal received in the via hole VH is connected to the second terminal T2 and the first terminal T1. When the irradiation of the laser LB is stopped, the molten metal received in the via hole VH is hardened to form the connection part CP, and the connection part CP is connected to the second terminal T2 and the first terminal T1 so that the first terminal T1 can be electrically connected to the second terminal T2 through the connection part CP.

Figure 6E:
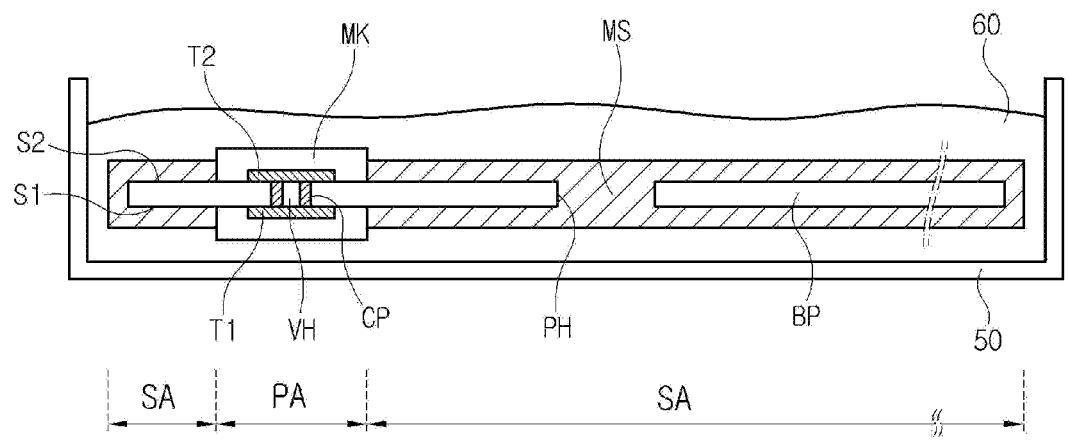
Figure 6F:
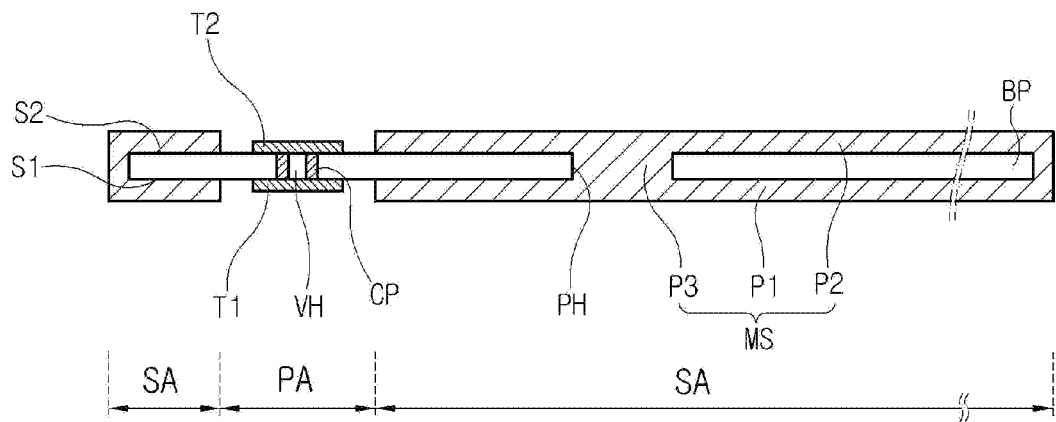

Referring to FIGS. 6E and 6F, a mask layer MK for covering the first terminal T1 and the second terminal T2 is formed in the connection area PA of the base part BP. In this embodiment, the mask layer MK can be formed by forming a photoresist on the entire surface of the base part BP and then patterning the photoresist.

In another embodiment, the mask layer MK can be a hydrophobic treated insulating layer, and the insulating layer can be adhered to the base part BP by the adhesive layer.

Thereafter, a plating liquid 60 is provided inside a vessel 50, and the base part BP on which the mask layer MK, the first terminal T1, and the second terminal T2 have been formed is soaked in the plating liquid 60 to perform the plating treatment on the surface of the base part BP. In this case, the plurality of through-holes PH formed to penetrate the base part BP can act as a flow path for passing through the plating liquid 60, and therefore, the plating liquid 60 disposed at the lower portion of the base part BP can easily flow through the upper portion of the base part BP through the plurality of through-holes PH. Therefore, the plating liquid 60 is uniformly provided to the first surface S1 and the second surface S2 side of the base part BP, and as a result, the first surface S1 and the second surface S2 of the base part BP exposed to the plating liquid 60 in the encapsulation area SA is subject to the plating treatment to form the metal encapsulation film MS.

In this embodiment, before forming the metal encapsulation film MS by performing the plating treatment, the seed layer of the plating treatment can be formed on the base part BP corresponding to an encapsulation area SA by performing the process of modifying the surface of the base part BP corresponding to the encapsulation area SA, or by using the sputtering process, and in this case, a process of forming the metal encapsulation film MS by using the plating treatment can be performed more easily.

After the metal encapsulation film MS is formed in the connection area PA of the base part BP, the mask layer MK is removed from the base part BP. As in this embodiment, when the mask layer MK has been formed of a photoresist layer, the mask layer MK can be removed by a strip process by using a developer. In addition, when the mask layer MK is removed, a metal layer (not illustrated) formed on the mask layer MK at the plating treatment can be removed from the base part BP together with the mask layer MK.

The mask layer MK is removed to complete the manufacture of the metal encapsulation film MS. The metal encapsulation film MS has the first portion P1 formed on the first surface S1 of the base part BP, the second portion P2 formed on the second surface S2 of the base part BP, and the third portion P3 filled inside the through-hole PH, and the first to third portions P1, P2, P3 of the base part BP are integrally formed.

In addition, the metal encapsulation film MS is formed in the encapsulation area SA, and the metal encapsulation film MS has an opened shape in the connection area PA. Therefore, the first terminal T1 and the second terminal T2 formed in the connection area PA can be exposed to the outside.

Figure 6G:
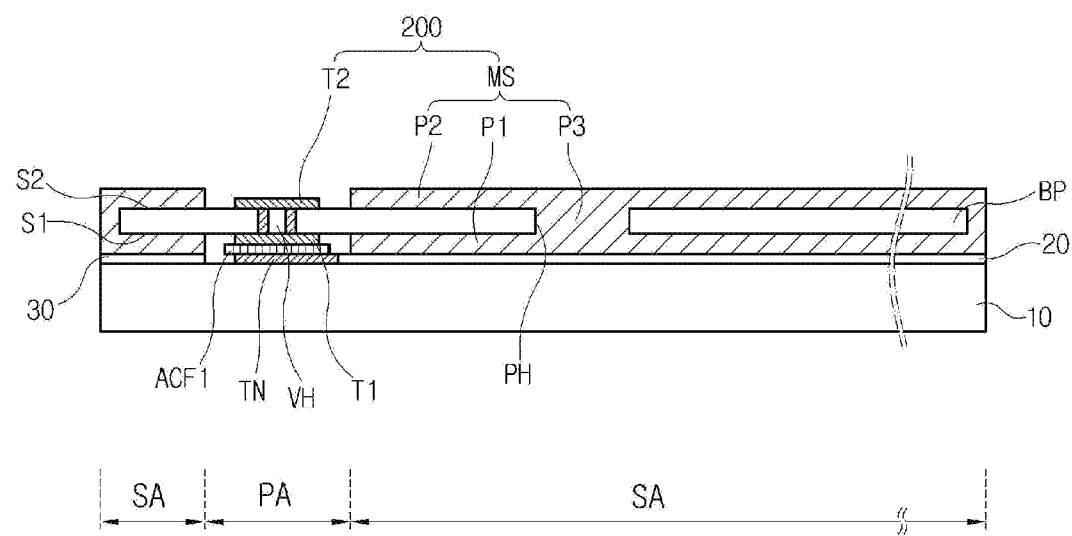

Referring to FIGS. 1, 2, and 6G, the encapsulation structure 200 is coupled to the base substrate 10 on which the pixel part 20 has been formed. In this embodiment, the adhesive layer 30 is formed in a closed loop shape along the edge of the base substrate 10, and thereafter, the encapsulation structure 200 can be bonded to the base substrate 10 so that the adhesive layer 30 is disposed between the base substrate 10 and the encapsulation structure 200.

In addition, the first anisotropic conductive film ACF1 is disposed between the panel terminal TN provided on the base substrate 10 and the first terminal T1, and the first anisotropic conductive film ACF1 is pressed thereon. In this embodiment, the first anisotropic conductive film ACF1 can be pressed by applying pressure to the second terminal T2. As a result, the panel terminal TN of the base substrate 10 and the first terminal T1 can be electrically connected by the first anisotropic conductive film ACF1.

The present disclosure is not limited to the order of the above-described process of bonding the encapsulation structure 200 to the base substrate 10 and the above-described process of electrically connecting the panel terminal TN of the base substrate 10 to the first terminal T1.

Thereafter, the second anisotropic conductive film ACF2 is disposed between the external terminal 310 of the circuit board 300 and the second terminal T2, and the second anisotropic conductive film ACF2 is pressed. As a result, the external terminal 310 of the circuit board 300 can be electrically connected to the second terminal T2 by the second anisotropic conductive film ACF2.

According to an embodiment of the present disclosure, the panel terminals connected to the plurality of pixels are disposed on a region arbitrarily set on the board, and the conductive components electrically connected to the panel terminals provided on the board can be embedded in the encapsulation structure that seals the plurality of pixels. Therefore, the circuit board is not directly bonded to the panel terminals provided on the board, and can be bonded to the conductive components embedded in the encapsulation structure to be connected to the panel terminals provided on the board indirectly and electrically.

As a result, since it is not necessary to provide the pad part at the edge of the board in order to bond the external circuit board to the panel terminals of the board, in an embodiment of the present disclosure, it is possible to remove the pad part of the organic light emitting display device, thereby further reducing the non-display area of the organic light emitting display device.

As described above, although the preferred embodiments of the present disclosure has been described, it can be deformed in various forms, and it is understood by those skilled in the art that various deformed examples and modified examples can be embodied without departing from the claims of the present disclosure.

What is claimed is:
1. An organic light emitting display device, comprising:
   a base substrate;
   a plurality of pixels disposed on the base substrate;
   a plurality of panel terminals disposed on the base substrate, the plurality of panel terminals electrically connected to the plurality of pixels; and
   an encapsulation structure coupled to the base substrate, the encapsulation structure covering the plurality of pixels,
   wherein the encapsulation structure comprises
      a base part having an encapsulation area and a connection area defined therein and having an insulating property;
      a metal encapsulation film coated on a whole surface of the base part corresponding to the encapsulation area;
      a plurality of first terminals disposed on a first surface of the base part corresponding to the connection area, the plurality of first terminals electrically connected to the plurality of panel terminals; and
      a plurality of second terminals disposed on a second surface of the base part opposite to the first surface corresponding to the connection area, the plurality of second terminals electrically connected to the plurality of first terminals,
      wherein a plurality of through-holes for passing through the base part are formed corresponding to the encapsulation area, and the plurality of through-holes are spaced apart from each other.
2. The organic light emitting display device of claim 1, further comprising a circuit board electrically connected to the plurality of second terminals.
3. The organic light emitting display device of claim 2, wherein the encapsulation structure covers the plurality of panel terminals disposed on the base substrate.
4. The organic light emitting display device of claim 1, wherein the encapsulation structure further comprises:
   a plurality of connection parts filled in a plurality of via holes, the plurality of connection parts penetrating the base part corresponding to the connection area, and
   wherein the plurality of connection parts contact the plurality of first terminals and the plurality of second terminals.
5. The organic light emitting display device of claim 1, wherein the metal encapsulation film has an opened shape corresponding to the connection area.
6. The organic light emitting display device of claim 1, wherein the metal encapsulation film comprises:
   a first portion disposed on the first surface of the base part corresponding to the encapsulation area;
   a second portion disposed on the second surface of the base part corresponding to the encapsulation area; and
   a third portion filled in the plurality of through-holes, wherein the first portion, the second portion, and the third portion have an integrally formed shape.

* * * * *